United States Patent
Stopel et al.

(10) Patent No.: US 7,583,105 B2
(45) Date of Patent: Sep. 1, 2009

(54) PULL-UP CIRCUIT

(75) Inventors: Rick Franciscus Jozef Stopel, Singapore (SG); Jerome Tjia, Singapore (SG)

(73) Assignee: NXP B.V., Eindhoven (NL)

( * ) Notice: Subject to any disclaimer, the term of this patent is extended or adjusted under 35 U.S.C. 154(b) by 549 days.

(21) Appl. No.: 10/597,089

(22) PCT Filed: Dec. 29, 2004

(86) PCT No.: PCT/IB2004/052934

§ 371 (c)(1),
(2), (4) Date: Jul. 11, 2006

(87) PCT Pub. No.: WO2005/078932

PCT Pub. Date: Aug. 25, 2005

(65) Prior Publication Data

US 2007/0152738 A1    Jul. 5, 2007

(30) Foreign Application Priority Data

Jan. 15, 2004    (EP)    ................... 04100111

(51) Int. Cl.
*H03K 19/0175*    (2006.01)
*H03K 19/094*    (2006.01)
*H03K 19/082*    (2006.01)

(52) U.S. Cl. .................. 326/85; 326/62; 326/63; 326/68; 326/81; 326/82; 326/83; 326/84; 326/80; 326/86; 326/87; 326/89; 326/90; 326/91; 710/313

(58) Field of Classification Search ............ None
See application file for complete search history.

(56) References Cited

U.S. PATENT DOCUMENTS 6,424,585 B1 * 7/2002 Ooishi ............ 365/226

* cited by examiner

*Primary Examiner*—Vibol Tan
*Assistant Examiner*—Matthew C Tabler

(57) ABSTRACT

A pull-up circuit comprises an operational amplifier which forms part of a feedback circuit, acting to bring a pull-up circuit output equal to a reference voltage input. The pull-up circuit may form part of a USB transceiver for incorporation in a USB Device. When the supply voltage of the USB Device is sufficiently high, it is used to provide the required pull-up voltage, with the feedback circuit including the operational amplifier the USB Device is not high enough to provide the required pull-up voltage. In that case, the USB bus voltage is used to generate the reference voltage which is used as an input to the feedback circuit.

20 Claims, 2 Drawing Sheets

PULL-UP CIRCUIT

This invention relates to a pull-up circuit, and in particular to a pull-up circuit which is suitable for use in a USB device.

Electronic devices can be interconnected by means of a Universal Serial Bus (USB), and the USB specifications specify various required features of USB-compatible devices.

The USB specifications specify two possible operating speeds for USB Devices, defined as full speed and low speed. The USB specifications then further specify two pins which are provided on USB Devices, for connection to respective bus lines, and require that a USB Device should pull one of the bus lines to a particular voltage when the bus line is in an idle state. If the D+ pin is pulled up to the required voltage, this indicates that the Device can operate at full speed, whereas, if the D− pin is pulled up to the required voltage, this indicates that the Device can only operate at low speed.

It is desirable to make battery powered portable devices USB-compatible, but such devices typically have low voltage power supplies, which makes it difficult for such devices to pull the required bus lines to the specified voltage.

In some cases, the required voltage can be provided from the bus voltage. However, the USB specifications also define on-the-go (OTG) devices, which can act either as a USB host or as a peripheral. Such devices cannot be powered exclusively by the bus voltage because, when they are acting as hosts, they must supply the bus voltage. In the case of USB OTG devices, therefore, there are specific factors which must be taken into consideration.

Moreover, integrating the pull-up circuit into the USB Device means that resistors can only be implemented with wide tolerances. This places further constraints on the form of the pull-up circuit.

According to the present invention, there is provided a pull-up circuit, comprising an operational amplifier which forms part of a feedback circuit, acting to bring a pull-up circuit output equal to a reference voltage input.

According to another aspect of the present invention, the pull-up circuit forms part of a USB transceiver for incorporation in a USB Device. When the supply voltage of the USB Device is sufficiently high, it is used to provide the required pull-up voltage, with the feedback circuit including the operational amplifier being enabled only when the supply voltage of the USB Device is not high enough to provide the required pull-up voltage. In that case, the USB bus voltage is used to generate the reference voltage which is used as an input to the feedback circuit.

FIG. 1 shows a USB Device in accordance with a first aspect of the present invention.

In this preferred embodiment of the present invention, the USB Device is a dual-role on-the-go (OTG) Device, as defined in the USB specifications, meaning that it can act as a USB Host or as a USB Peripheral, depending on the circumstances of its use. However, the invention is equally applicable to other USB Devices.

Figure 1:
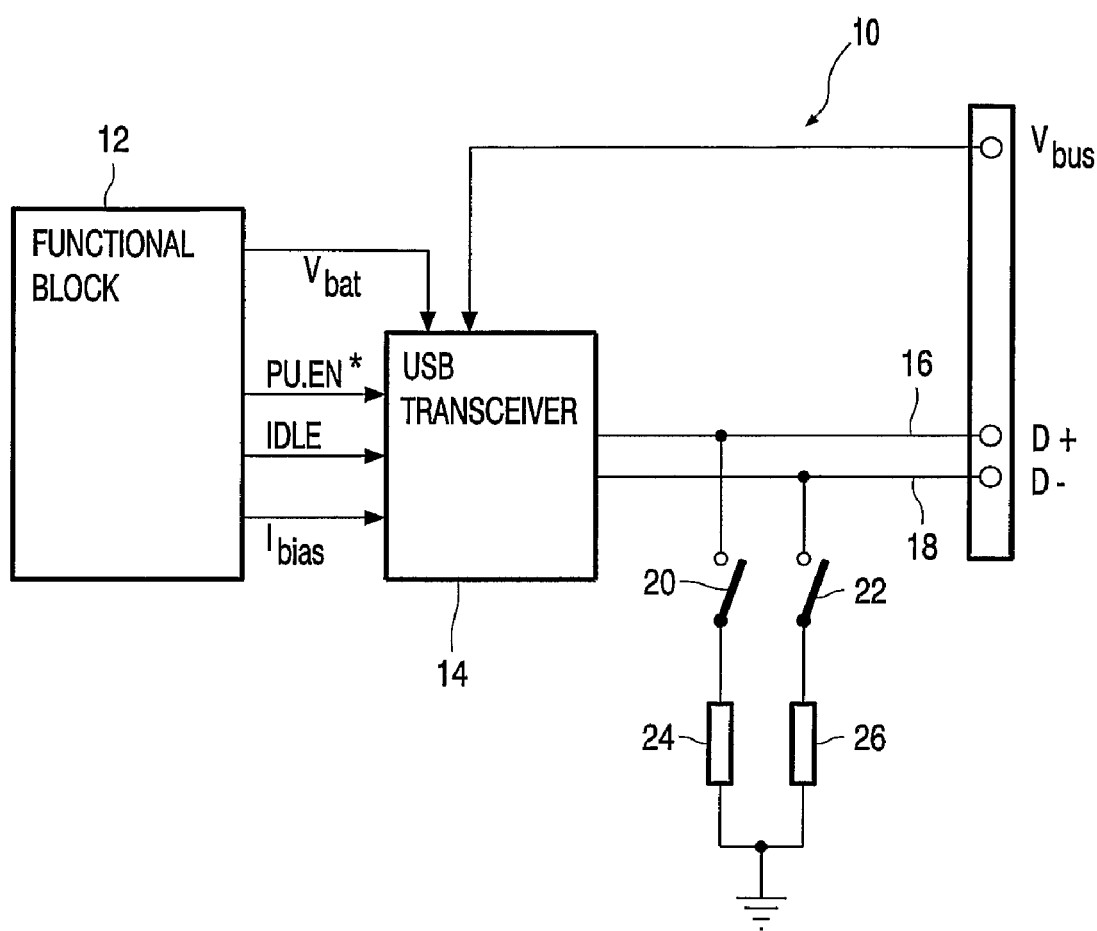
FIG. 1 is a schematic diagram of a USB OTG device in accordance with an aspect of the present invention.

Thus, FIG. 1 shows a USB OTG Device 10, having a functional block 12, which performs many of the desired operational functions of the USB Device. For example, the USB Device 10 may be a microprocessor or a digital signal processor, in which cases the functional block 12 performs the functions of the microprocessor or digital signal processor.

The USB Device 10 also includes a USB transceiver 14, which has a role in configuring the connection of the USB Device 10 over a USB bus to another such Device. The USB Device 10 also has a USB connection, including a bus pin Vbus, and bus lines D+ and D−. The signals on the D+ bus line 16 and the D− bus line 18 indicate the status of the USB Device 10 to the other USB Device.

More specifically, when the D+ bus line 16 or the D− bus line 18 is pulled up to a specified voltage, in the range from 2.7V-3.6V, this indicates that the USB Device 10 is acting as a USB Peripheral. When the D+ bus line 16 and the D− bus line 18 are pulled down, by closing the switches 20, 22, and connecting the bus lines to ground through the respective resistors 24, 26, this indicates that the USB Device 10 is acting as a USB Host. When it is the D+ bus line 16 which is pulled up or down in this way, this indicates that the USB Device 10 can operate at full speed, as defined in the USB specifications. When it is the D− bus line 18 which is pulled up or down in this way, this indicates that the USB Device 10 can operate at low speed, as defined in the USB specifications.

As described so far, the USB Device 10 is generally conventional, and so the other functions and features of the device will not be described in further detail.

Figure 2:
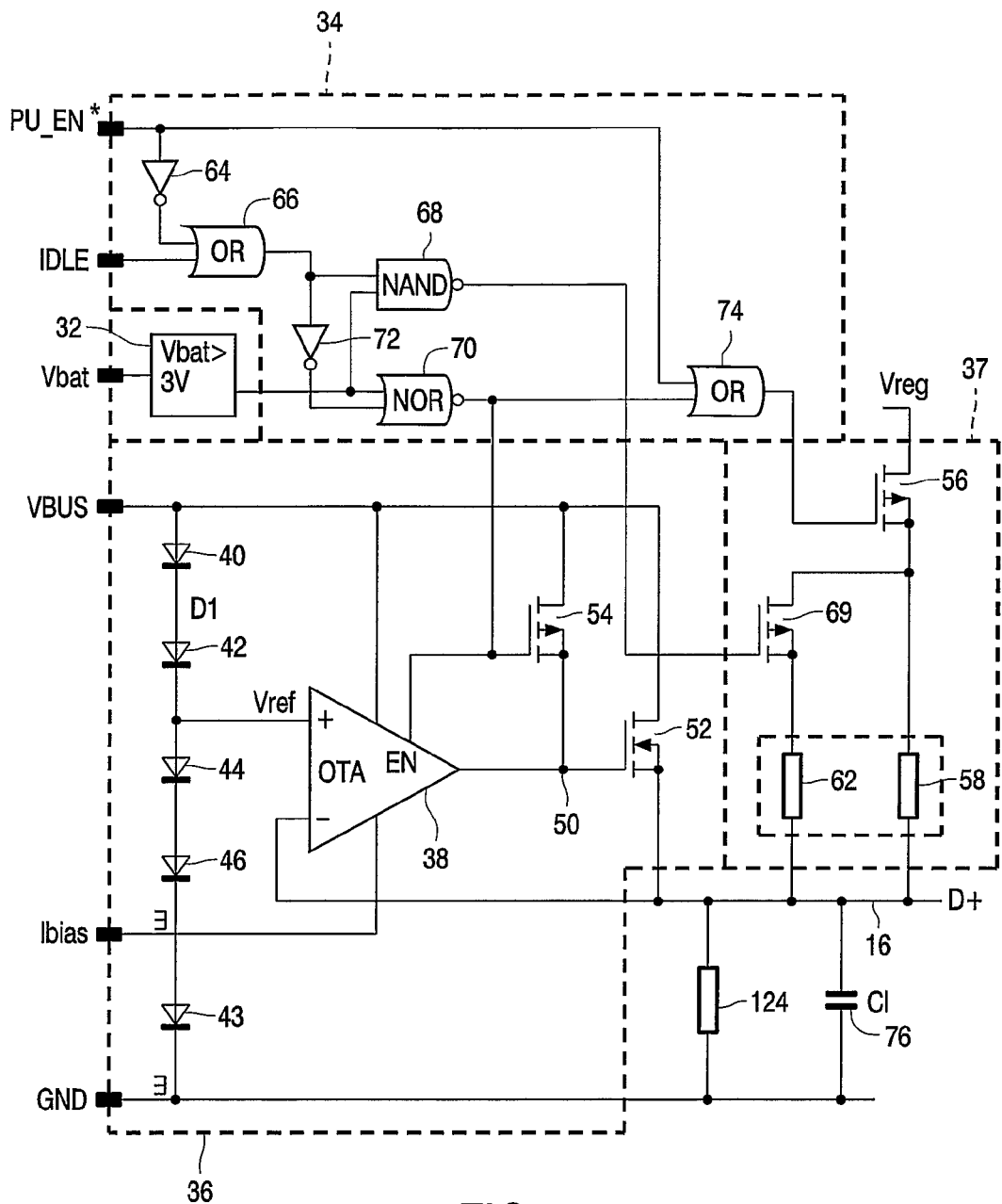
FIG. 2 is a circuit diagram of a pull-up circuit, in accordance with another aspect of the present invention, in the USB device of FIG. 1.

FIG. 2 shows in more detail the form of a pull-up circuit in the USB transceiver 14. In preferred embodiments of the invention, the USB transceiver can be provided as an integrated circuit, which includes two such pull-up circuits, and also includes the pull down resistors 24, 26 and their associated switches 20, 22, plus a DC-DC regulator for forming a regulated voltage Vreg (for example at 3.3V) from the supply voltage Vbat of the USB Device 10. The USB transceiver 14 preferably also includes other circuitry, which can be of a type which is generally known, for performing other required features. For example, the USB transceiver 14 preferably also includes circuitry for forming an identification signal, and circuitry for monitoring and pulsing the bus line.

As also shown in FIG. 1, the USB transceiver receives as inputs the bus voltage Vbus, a bias current Ibias from the functional block 10, plus logic signal inputs PU_EN* and IDLE, also from the functional block 10. FIG. 2 shows the form of the pull-up circuit connected to the D+ line 16. Thus, in the USB transceiver 14 there is another such pull-up circuit, connected to the D− line 18.

The logic signal input IDLE is high when the USB Device 10 is in the idle mode. In this situation, it is required that the USB Device should indicate whether it can act as a USB Host or a USB peripheral, and whether it can operate at full speed or only at low speed. The logic signal input PU_EN* is low when this pull-up circuit is required to operate. Thus, in the case of this pull-up circuit connected to the D+ line 16, this logic input is low when the USB Device can act as a USB Peripheral at full speed.

Thus, when the USB Device 10 is acting as a USB Host, the pull-down resistors 24, 26 are both activated, by closing the switches 20, 22. The USB Device can then detect whether another connected USB Device is operating at full speed or at low speed, by sensing which of its pull-up resistors is activated. When the USB Device 10 is acting as a USB Peripheral, one of the two pull-up circuits is activated. The pull-up circuit connected to the D+ line 16 is activated when the USB Device is operating at full speed, and the pull-up circuit connected to the D− line 18 is activated when the USB Device is operating at low speed.

The pull-up circuit shown in FIG. 2 is connected to the D+ line 16, and will be described further on that basis, but the pull-up circuit connected to the D− line 18 is essentially identical, although the logic signals operate to ensure that the appropriate one of the circuits is activated as required.

The supply voltage Vbat of the USB Device 10 is applied to a comparator block 32, which determines whether the supply voltage Vbat exceeds 3V. The output of the comparator block 32, and the logic signal inputs PU_EN* and IDLE are applied to logic circuitry 34. When the supply voltage Vbat is lower than 3V, the logic circuitry 34 acts such that the output voltage, on the D+ bus line 16, is generated by active pull-up circuitry 36 from the bus voltage Vbus. However, when the supply voltage Vbat exceeds 3V, the active pull-up circuitry 36 is not required, and the output voltage, on the D+ bus line 16, is generated from the supply voltage Vbat by alternative pull-up circuitry 37.

The active pull-up circuitry 36 includes an operational transconductance (OTA) amplifier 38, which receives a reference voltage Vref on its non-inverting input terminal. The reference voltage Vref is generated from a string of five diodes 40, 42, 44, 46, 48, connected in series between the bus voltage Vbus and ground. As is known, the resistances of the diodes 40, 42, 44, 46, 48 depend on their respective width/length (W/L) ratios, and these can be adjusted such that the reference voltage Vref takes a desired value. For example, for a nominal bus voltage of 5V, a value of the reference voltage Vref in the region of 3.1V-3.2V will usually be sufficient, as, with a +/−10% variation on the bus voltage, this will ensure that the reference voltage Vref still falls within the range of 2.7V-3.6V specified for the pull-up voltage on the D+ bus line 16. Typically, the resistance of the diodes 40, 42, 44, 46, 48 will be high enough that there will be minimal current leakage (for example, a maximum of 2 μA) through the diodes.

The output terminal 50 of the OTA amplifier 38 is connected to the gate of a first NMOS transistor 52. The drain of the first NMOS transistor 52 is connected to the bus voltage Vbus, while the source of the first NMOS transistor 52 is connected to the D+ bus line 16, which is also connected to the inverting input of the OTA amplifier 38.

A first PMOS transistor 54 has its drain connected to the bus voltage Vbus, and its source connected to the output terminal 50 of the OTA amplifier 38. The gate of the first PMOS transistor 54 receives a logic signal from the logic circuitry 34, which is also supplied to an enable input of the OTA amplifier 38.

The alternative pull-up circuitry 37 includes a second PMOS transistor 56, having its drain connected to the regulated voltage Vreg (for example at 3.3V), which is formed from the supply voltage Vbat of the USB Device 10, and its source connected to the D+ bus line 16 through a first pull-up resistor 58. The gate of the second PMOS transistor 56 receives a second logic signal from the logic circuitry 34.

The alternative pull-up circuitry 37 also includes a third PMOS transistor 60, having its drain connected to the source of the second PMOS transistor 56, and its source connected to the D+ bus line 16 through a second pull-up resistor 62. The gate of the third PMOS transistor 60 receives a third logic signal from the logic circuitry 34.

In the logic circuitry 34, the logic signal input PU_EN* is connected through a first inverter 64 to a first input of a first OR gate 66. The logic signal input IDLE is connected to a second input of the first OR gate 66.

The output of the first OR gate 66 is connected to a first input of a NAND gate 68. The output of the comparator block 32 is connected to a second input of the NAND gate 68.

The output of the comparator block 32 is also connected to a first input of a NOR gate 70. The output of the first OR gate 66 is connected through a second inverter 72 to a second input of the NOR gate 70.

The logic signal input PU_EN* is also connected to a first input of a second OR gate 74. The output of the NOR gate 70 is connected to the second input of the second OR gate 74.

The output of the NOR gate 70 forms the first logic signal input to the active pull-up circuitry 36, specifically to the gate of the first PMOS transistor 54 and the enable signal input of the OTA 38. The output of the second OR gate 74 forms the first logic signal input to the alternative pull-up circuitry 37, specifically to the gate of the second PMOS transistor 56. The output of the NAND gate 68 forms the second logic signal input to the alternative pull-up circuitry 37, specifically to the gate of the third PMOS transistor 60.

The logic circuit therefore operates such that, when the logic signal input PU_EN* is low, and the logic signal input IDLE is high, the pull-up circuit is activated, to place a voltage within the range of 2.7V-3.6V on the D+ bus line 16, and thereby indicate that the USB Device can act as a USB Peripheral at full speed.

More specifically, in operation of the device, when the logic signal input IDLE is high and the supply voltage Vbat exceeds 3V, it is determined that the supply voltage is sufficient to provide the output voltage on the D+ bus line 16. Thus, when the comparator block 32 determines that the supply voltage Vbat exceeds 3V, the first logic signal input to the active pull-up circuitry 36, specifically to the enable signal input of the OTA 38, is low. Therefore, the OTA 38 is disabled. At the same time, the first and second logic signal inputs to the alternative pull-up circuitry 37, specifically to the gates of the second and third PMOS transistors 56, 60 respectively, are also low. As a result, the PMOS transistors 56, 60 are turned on, and the voltage on the D+ bus line 16 is brought up towards the level of the regulated voltage Vreg obtained from the supply voltage Vbat, with the resistance values of the resistors 58, 62 being such that the voltage drop across them is sufficiently small that the voltage on the D+ bus line 16 is at least 2.7V for all values of the supply voltage Vbat greater than 3V.

The voltage drop across the resistors 58, 62 depends on the combined resistance of the resistors 58, 62, and on the resistance value of the pull-down resistor 124 in the device which is acting as the USB Host. In accordance with the USB Specification Revision 2.0, USB Engineering Change Note, this pull-down resistor should have a value in the range 14.25 kohm-24.8 kohm. This means that the idle voltage is pulled up almost to the regulated voltage Vreg.

When the logic signal input IDLE is low, however, that is, the device is in the active state rather than the idle state, it is not necessary to maintain the idle voltage, but it is disadvantageous for the pull-up resistance to be too low, as this adversely impacts quality of the transmitted signals. In that case, the logic circuitry operates to switch the resistor 62 out of the circuit, so that the value of the pull-up resistance is increased. According to the USB Specification Revision 2.0, USB Engineering Change Note, the value of the pull-up resistance shall be in the range 900 ohm-1575 ohm when the device is in the idle state, and in the range 1425 ohm-3090 ohm when the connected USB Host Device is in the active state.

When the comparator block 32 determines that the supply voltage Vbat is lower than 3V, the first and second logic signal inputs to the alternative pull-up circuitry 37 are high. As a result, the PMOS transistors 56, 60 are turned off. At the same time, the first logic signal input to the active pull-up circuitry 36, specifically to the enable signal input of the OTA 38, is also high. Therefore, the OTA 38 is enabled. Meanwhile, the gate of the first PMOS transistor 54 is also brought high, so that this transistor is switched off.

The OTA 38 therefore forms the basis for a feedback circuit, which acts to bring the voltage on the D+ bus line 16 to the level of the reference voltage Vref, since, as is usual with operational amplifiers, the non-inverting input and the inverting input of the OTA must have the same voltage level. More specifically, the first NMOS transistor 52 acts as a current source, which is controlled by the OTA 38, and therefore maintains the voltage on the D+ bus line 16 at the level of the reference voltage Vref.

Since the active pull-up circuitry 36 includes a feedback loop, it is necessary to consider its stability. FIG. 2 shows the capacitance on the D+ bus line 16 as a capacitor 76, having a capacitance value C1. In practice, the capacitance value C1 can lie anywhere in the range from 0 pF -1000 pF, and so it is necessary that the feedback loop should include an internal dominant pole, so that the stability of the feedback loop does not depend on the capacitance value C1. In this preferred embodiment of the invention, this is achieved by including a Miller capacitor having a value of 4.5 pF in the OTA.

In this preferred embodiment of the invention, the pull-down resistors 24, 26 shown in FIG. 1, are also integrated into the USB transceiver 14. If the USB Device 10 is acting as a USB Host, the switches 20, 22 are closed, in order to activate the resistors 24, 26.

There is therefore provided a pull-up circuit, and an associated USB transceiver circuit, which ensure that the voltage on the D+ line (or D- line, as required) of a USB Device is maintained at the required level, even for low voltage devices, despite possible variations in the available bus voltage.

The pull-up circuit according to the preferred embodiment of the invention determines whether the available battery voltage is sufficient to provide the required voltage on the D+ or D- line, and activates active pull-up circuitry only in the event that the available battery voltage is insufficient. However, the active pull-up circuitry based around the OTA 38 can also be used in USB Devices without having available the option of using the battery voltage to provide the required voltage on the D+ or D- line.

It will also be apparent to the person skilled in the art that other changes may be made to the circuit, without altering fundamentally the operation thereof. For example, some or all of the PMOS and NMOS transistors in the active pull-up circuitry can be replaced by NMOS or PMOS transistors, as the case may be, with appropriate changes to the applied logic signals.

The invention claimed is:

1. A pull-up circuit, comprising:
   a pull-up circuit output;
   logic circuitry to generate an enable signal in response to a battery supply voltage;
   an active pull-up circuit block that, in response to a first logical value of the enable signal, brings the voltage on the pull-up circuit output to a reference voltage derived from an external voltage supply, the pull-up circuit block including
      a first input providing the reference voltage;
      a second input;
      an operational amplifier, having a reference voltage input connected to the first input thereof and an output, and
      a first transistor, controlled by the output of the operational amplifier, the first transistor having a first terminal connected to a first supply voltage input and having a second terminal connected to the pull-up circuit output and to the second input of the operational amplifier; and
   an alternative pull-up circuit block that, in response to a second logical value of the enable signal, brings the voltage on the pull-up circuit output to a reference voltage derived from the battery supply.

2. A pull-up circuit as claimed in claim 1, further comprising a plurality of diodes, connected in series between the first supply voltage input and ground, with the reference voltage input connected at an intermediate point in said series connection of diodes.

3. A pull-up circuit as claimed in claim 1, wherein the first input of the operational amplifier is the noninverting input, and the second input of the operational amplifier is the inverting input.

4. A pull-up circuit as claimed in claim 1, wherein the first transistor is an NMOS transistor.

5. A pull-up circuit as claimed in claim 1, further comprising:
   a second transistor, having its conducting path connected between the first supply voltage input and the output of the operational amplifier, controlled such that it is turned off while the operational amplifier is enabled.

6. A pull-up circuit as claimed in claim 5, wherein the second transistor is a PMOS transistor.

7. A pull-up circuit as claimed in claim 1, further comprising:
   a pull-up resistance, switchably connected between a second supply voltage input and the pull-up circuit output; and
   logic circuitry, for determining whether a voltage on the second supply voltage input is greater than a threshold voltage and,
   when it is determined that the voltage on the second supply voltage input is greater than the threshold voltage, for disabling the operational amplifier and for connecting the pull-up resistance between the second supply voltage input and the pull-up circuit output, and
   when it is determined that the voltage on the second supply voltage input is not greater than the threshold voltage, for enabling the operational amplifier and for disconnecting the pull-up resistance.

8. A pull-up circuit as claimed in claim 7, wherein the pull-up resistance is switchably connected between a regulated voltage obtained from the second supply voltage input and the pull-up circuit output.

9. A pull-up circuit as claimed in claim 7, wherein the pull-up resistance comprises first and second resistors connected in parallel between the second supply voltage input and the pull-up circuit output when the pull-up circuit is in idle mode, and wherein one of said resistors is deactivated to thereby increase the pull-up resistance when the pull-up circuit is in active mode.

10. A USB transceiver, comprising a pull-up circuit as claimed in claim 1, wherein the first terminal is connectable to a USB bus voltage.

11. A USB transceiver, for use in a USB Device, the USB transceiver comprising a pull-up circuit as claimed in claim 7, wherein the first terminal is connectable to a USB bus voltage, and wherein the second supply voltage input of the pull-up circuit is connectable to a power supply of the USB Device.

12. A USB transceiver, as claimed in claim 11, further comprising a DC-DC converter, for forming a regulated voltage from the power supply of the USB Device, wherein the pull-up resistance is switchably connected between the regulated voltage and the pull-up circuit output.

13. A USB transceiver as claimed in claim 10, comprising a first pull-up circuit having its pull-up circuit output connected to a D+ line of a USB Device, and a second pull-up circuit having its pull-up circuit output connected to a D line of a USB Device.

14. A transceiver as claimed in claim 10, suitable for use in a USB on-the-go device.

15. A USB device, comprising a USB transceiver as claimed in claim 10.

16. A USB on-the-go device, comprising a USB transceiver as claimed in claim 10.

17. A pull-up circuit, comprising:
- an operational amplifier, having a reference voltage input connected to a first input thereof; and
- a first transistor, controlled by the output of the operational amplifier, the first transistor having a first terminal connected to a first supply voltage input and having a second terminal connected to a pull-up circuit output and to a second input of the operational amplifier;
- such that, when the operational amplifier is enabled, it acts to bring the voltage on the pull-up circuit output equal to the voltage on the reference voltage input, wherein the pull-up resistance comprises first and second resistors connected in parallel between the second supply voltage input and the pull-up circuit output when the pull-up circuit is in idle mode;
- a pull-up resistance, switchably connected between a second supply voltage input and the pull-up circuit output; and
- logic circuitry, for determining whether a voltage on the second supply voltage input is greater than a threshold voltage and,
- when it is determined that the voltage on the second supply voltage input is greater than the threshold voltage, for disabling the operational amplifier and for connecting the pull-up resistance between the second supply voltage input and the pull-up circuit output, and
- when it is determined that the voltage on the second supply voltage input is not greater than the threshold voltage, for enabling the operational amplifier and for disconnecting the pull-up resistance.

18. A pull-up circuit as claimed in claim 17, wherein one of said resistors is deactivated to thereby increase the pull-up resistance when the pull-up circuit is in active mode.

19. A USB transceiver, comprising a pull-up circuit as claimed in claim 17, wherein the first terminal is connectable to a USB bus voltage.

20. A USB transceiver, for use in a USB Device, the USB transceiver comprising a pull-up circuit as claimed in claim 17, wherein the first terminal is connectable to a USB bus voltage, and wherein the second supply voltage input of the pull-up circuit is connectable to a power supply of the USB Device.

* * * * *